United States Patent
Li et al.

(10) Patent No.: US 12,414,312 B2
(45) Date of Patent: Sep. 9, 2025

(54) BACK-END-OF-LINE THIN FILM RESISTOR

(71) Applicant: International Business Machines Corporation, Armonk, NY (US)

(72) Inventors: Baozhen Li, South Burlington, VT (US); Chih-Chao Yang, Glenmont, NY (US); Ashim Dutta, Clifton Park, NY (US); Huimei Zhou, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 749 days.

(21) Appl. No.: 17/645,208

(22) Filed: Dec. 20, 2021

(65) Prior Publication Data

US 2023/0197606 A1 Jun. 22, 2023

(51) Int. Cl.
  *H10D 1/47* (2025.01)
  *H01L 21/768* (2006.01)
  *H01L 23/522* (2006.01)
  *H01L 23/528* (2006.01)

(52) U.S. Cl.
  CPC ....... *H10D 1/474* (2025.01); *H01L 21/76802* (2013.01); *H01L 21/76877* (2013.01); *H01L 23/5226* (2013.01); *H01L 23/5228* (2013.01); *H01L 23/5283* (2013.01)

(58) Field of Classification Search
  CPC ... H01L 23/522–53295; H01L 21/768–76898; H01L 2221/10–1094; H01L 23/5283; H01L 23/5226; H01L 23/5228; H10D 1/40; H10D 1/47; H10D 1/474
  See application file for complete search history.

(56) References Cited

U.S. PATENT DOCUMENTS

| | | | |
|---|---|---|---|
| 3,922,708 A * | 11/1975 | Crowder | H10D 1/47 257/E21.248 |
| 6,730,573 B1 | 5/2004 | Ng et al. | |
| 6,921,962 B1 | 7/2005 | Bailey et al. | |
| 6,962,875 B1 * | 11/2005 | Stamper | H01L 21/76838 257/E21.582 |
| 7,193,500 B2 | 3/2007 | Chinthakindi et al. | |
| 7,715,248 B2 | 5/2010 | Aitken et al. | |
| 8,093,679 B2 | 1/2012 | Chinthakindi et al. | |
| 9,627,467 B2 | 4/2017 | Tseng et al. | |
| 10,269,735 B1 * | 4/2019 | Shukla | H10D 84/611 |

(Continued)

FOREIGN PATENT DOCUMENTS

WO  2019241094 A1  12/2019

OTHER PUBLICATIONS

Winiakrski et al., "Electrical Properties of Thin-Film Resistors in a Wide Temperature Range," Circuit World, vol. 41, Year: 2015, pp. 116-120.

*Primary Examiner* — Scott B Geyer
(74) *Attorney, Agent, or Firm* — Patterson + Sheridan, LLP (57) ABSTRACT

Method and resistive structure is provided herein. The resistive structure includes a semiconductor substrate comprising one or more circuit elements and a first interconnect layer disposed on the substrate. The first interconnect layer is between a resistive layer and the semiconductor substrate. A dielectric layer is disposed between the first interconnect layer and the resistive layer. A via extending through the dielectric layer forms an electrical connection between the first interconnect layer and the resistive layer.

16 Claims, 6 Drawing Sheets

(56) References Cited

U.S. PATENT DOCUMENTS

| | | | |
|---|---|---|---|
| 10,553,336 B2 | 2/2020 | Leng et al. | |
| 2003/0170934 A1* | 9/2003 | Lin | H01L 21/76807 |
| | | | 257/E21.582 |
| 2004/0166659 A1* | 8/2004 | Lin | H01L 23/53295 |
| | | | 257/E21.582 |
| 2005/0040494 A1* | 2/2005 | Huttemann | H01C 17/08 |
| | | | 257/E27.047 |
| 2005/0067701 A1* | 3/2005 | Coolbaugh | H01L 21/7687 |
| | | | 257/762 |
| 2006/0063371 A1* | 3/2006 | Lin | H10D 1/20 |
| | | | 257/E23.152 |
| 2006/0063378 A1* | 3/2006 | Lin | H01L 24/11 |
| | | | 257/E23.152 |
| 2006/0255439 A1* | 11/2006 | Ikegami | H01L 21/7687 |
| | | | 257/E27.081 |
| 2009/0302993 A1* | 12/2009 | Fujiwara | H01L 23/5228 |
| | | | 338/314 |
| 2011/0177668 A1* | 7/2011 | Yeh | H10D 86/85 |
| | | | 257/E21.004 |
| 2012/0049324 A1* | 3/2012 | Le Neel | H01L 23/5228 |
| | | | 438/384 |
| 2013/0093055 A1* | 4/2013 | Lee | H01L 23/5228 |
| | | | 257/E27.047 |
| 2013/0181221 A1* | 7/2013 | Kaneko | H03K 19/00 |
| | | | 438/158 |
| 2014/0054746 A1* | 2/2014 | Ohtake | H01L 23/528 |
| | | | 257/536 |
| 2015/0187632 A1* | 7/2015 | Ali | H01L 21/76834 |
| | | | 438/384 |
| 2016/0204100 A1* | 7/2016 | Zhang | H10D 84/811 |
| | | | 438/210 |
| 2016/0322166 A1* | 11/2016 | Ashimine | H01L 21/768 |
| 2018/0019297 A1* | 1/2018 | Dirnecker | H01L 21/268 |
| 2018/0145088 A1* | 5/2018 | Shank | H10D 84/0151 |
| 2018/0211952 A1* | 7/2018 | Shin | H01L 23/5226 |
| 2019/0181215 A1* | 6/2019 | Ogino | H01L 23/5228 |
| 2019/0221516 A1* | 7/2019 | Kande | H01L 23/5228 |
| 2019/0295947 A1* | 9/2019 | Kim | H01L 23/5226 |
| 2020/0235087 A1* | 7/2020 | Ding | H01L 23/5228 |
| 2021/0057338 A1* | 2/2021 | Itomi | H01L 23/552 |
| 2021/0134940 A1* | 5/2021 | Kuo | H01L 21/76802 |
| 2021/0183695 A1* | 6/2021 | Chang | H01L 21/7681 |
| 2021/0233841 A1* | 7/2021 | Kubo | H01L 23/5286 |
| 2021/0257296 A1* | 8/2021 | Chan | H01L 23/5228 |
| 2021/0391253 A1* | 12/2021 | Yang | H10D 1/692 |
| 2023/0046455 A1* | 2/2023 | Wong | H10D 1/474 |
| 2023/0058805 A1* | 2/2023 | Tanaka | H05K 1/0298 |
| 2023/0063793 A1* | 3/2023 | Hsu | H10D 88/00 |
| 2023/0081749 A1* | 3/2023 | Leng | H10D 1/00 |
| | | | 257/532 |

\* cited by examiner

FIG. 11

BACK-END-OF-LINE THIN FILM RESISTOR

BACKGROUND

The present disclosure relates to back-end-of-line (BEOL) resistors, and more specifically, to BEOL resistive structures having enhanced stability and enhanced thermal dissipation capability.

Thin film resistors are widely used in integrated circuits. As technology scales to smaller interconnects, resistance can increase rapidly. Generally, for new technology nodes, resistors are moved from middle-of-line to BEOL. The resistor can be situated in a structure having a semiconductor substrate with fins coupled to the substrate, such as in a fin field-effect transistor patterned by extreme ultraviolet lithography.

SUMMARY

According to an embodiment of the present disclosure, a resistive structure is provided herein. The resistive structure includes a semiconductor substrate having one or more circuit elements and a first interconnect layer disposed on the substrate. The first interconnect layer is between a resistive layer and the semiconductor substrate. A dielectric layer is disposed between the first interconnect layer and the resistive layer. A contact via extending through the dielectric layer forms an electrical connection between the first interconnect layer and the resistive layer.

According to an embodiments, a method for forming a resistive structure is provided including depositing a first interconnect layer on a substrate having one or more circuit elements, depositing a cap layer over the first interconnect layer, depositing a resistive layer over the cap layer, and etching one or more openings through the resistive layer and the cap layer. The one or more openings extend to the first interconnect layer. The method further includes filling the one or more openings with a conductive material to form contact vias. The resistive layer contacts the one or more contact vias to form an electrical connection with the first interconnect layer.

According to some embodiments, a method for forming a resistive structure is provided including depositing a first interconnect layer on a substrate having one or more circuit elements. The method includes depositing a cap layer over the first interconnect layer, etching one or more openings through the cap layer and filling the one or more openings to form one or more studs. The one or more studs extend through the cap layer to the first interconnect layer. The method further includes depositing a resistive layer over the cap layer. The resistive layer contacts the one or more studs to form an electrical connection with the first interconnect layer.

DETAILED DESCRIPTION

The present disclosure is directed to back-end-of-line (BEOL) thin film resistor (TFR) structures disposed on a substrate. The resistor forms a portion of an integrated circuit. Compared to middle-of-line structures, BEOL TFRs are spaced a greater distance away from the substrate. The resistor is surrounded by material having lower thermal conductivity, such as a dielectric constant (K) of about 3.5 or less, such as about 2.7 or less, such as about 2.5 or less. Relative to middle-of-line resistors, reduced thermal dissipation is observed in conventional BEOL resistors. Conventional solutions to the reduced thermal dissipation include limiting the electrical current passing through the resistor, setting an exclusion zone for metal wiring, or derating the electromigration limit for the vias and lines connected to (or proximate to) the TFR. Each of these solutions limit or compromise the performance of the final device. The resistors described herein provide the benefits of BEOL transistors without affecting the performance of the devices, such as limiting current for electromigration, while enhancing thermal dissipation. In particular, contact vias are formed in the resistive structures extending at least partially through a resistive layer of the structure, or at least partially below the resistive layer of the structure. Conventional contact vias are typically disposed above resistive layers. A short length effect for the connecting conductor wires is observed for electromigration within resistors of the present disclosure. The resulting electromigration limit is less sensitive to temperature rise. Moreover, the metal connection line disposed below the resistive layer is at a lower level and enhances thermal dissipation to the substrate.

Additionally, when high amounts of current passes through conventional resistors, high amounts of joule heating can occur, especially at a bottom of the contact vias, which can accelerate electromigration and form a void. Formation and growth of voids can affect device performance by opening the circuit of the device. As used herein, the term "electromigration" refers to migration of metal atoms gradually moving through a conductor due to momentum transfer between conducting electrons and diffusing metal atoms, which can cause electrical openings or shorting. Electromigration can be reduced at the expense of current allowance. It has been discovered that resistors of the present disclosure are substantially free of voids and more resistant to high temperatures.

Figure 1:
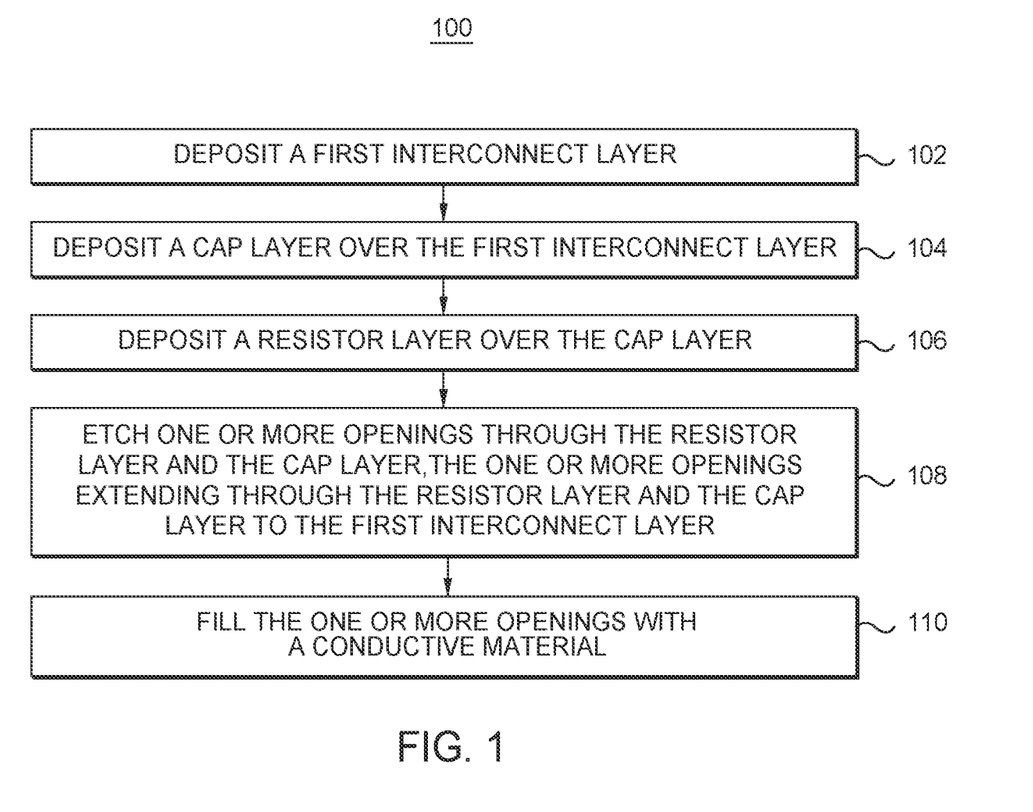
FIG. 1 depicts a flow diagram for a method of forming a thin film resistive structure according to some embodiments.

FIG. 1 depicts a flow diagram for a method 100 of forming a thin film resistive structure according to some embodiments and is illustrated. The method 100 includes, at block 102, depositing a first interconnect layer over a substrate, at block 104, depositing a cap layer over the first interconnect layer, at block 106, depositing and patterning a resistive layer over the cap layer, and at block 108, etching one or more openings through the resistive layer and the cap layer. The one or more openings extend through the resistive layer and the cap layer to the first interconnect layer. At block 110, the one or more openings are filled with a conductive material. The filled openings can be referred to as contact vias, metal connections, or studs. FIGS. 2-5 illustrate one example of performing the method 100.

Figure 2:
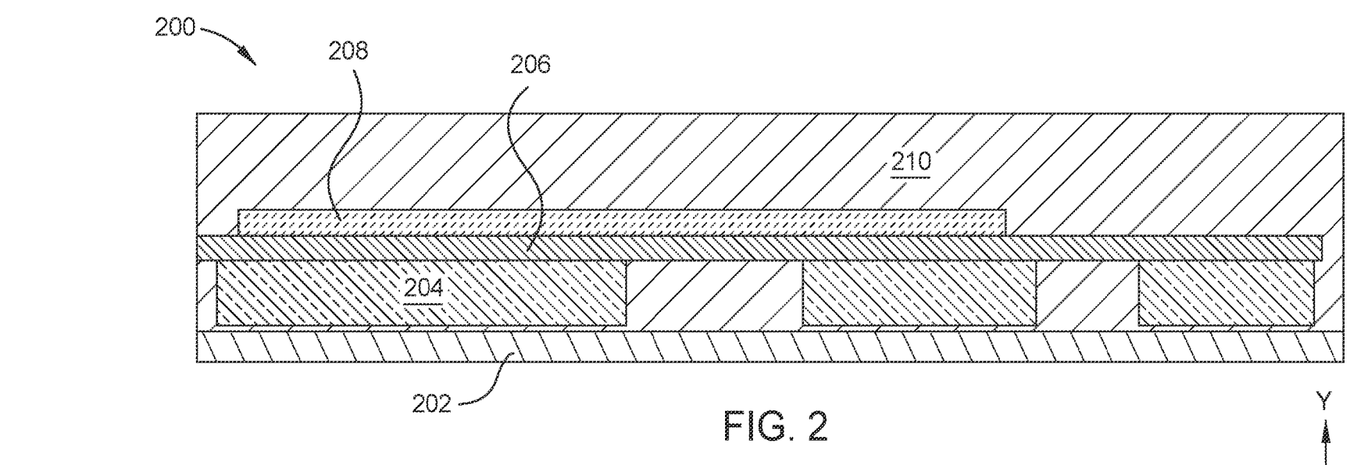
FIG. 2 depicts a structure with a resistive layer disposed over a capping layer and interconnect layer according to some embodiments.

FIG. 2 depicts a structure 200 corresponding to block 102 of the method 100. Specifically, FIG. 2 depicts the structure 200 after depositing a first interconnect layer 204 over a substrate 202. The first interconnect layer 204 can be deposited using any suitable method and can include conductive materials, such as copper, cobalt, ruthenium, aluminum, combinations thereof, or alloys thereof. Other conductive materials, such as other metals are also contemplated. In one embodiment, the first interconnect layer 204 is a first interconnect layer disposed closest to the substrate 202. Alternatively, in one embodiment, the first interconnect layer is disposed above one or more additional interconnect layers (not shown).

In one embodiment, the substrate 202 is a semiconductor substrate that contains transistors, and other circuit elements of an integrated circuit. Thus, the process illustrated in FIGS. 2-5 is a BEOL process that occurs after the circuitry in the substrate 202 (e.g., transistors) has been formed.

The first interconnect layer 204 is patterned and etched using any suitable method. A cap layer 206 is formed over the first interconnect layer 204, which corresponds to block 104 of the method 100. In some embodiments, the cap layer 206 is composed of a dielectric material. In some embodiments, the cap layer 206 is a protective cap such as silicon nitride, silicon carbide (e.g., nitrogen doped silicon carbide), aluminum nitride, oxy-nitride, or combination(s) thereof. In some embodiments, the cap layer 206 is a silicon-containing material. A resistive layer 208 is deposited and patterned over the cap layer 206 which corresponds to block 106 of the method 100. The resistive layer 208 is composed of SiCr, TiN, TaN, or other resistive materials.

Figure 3:
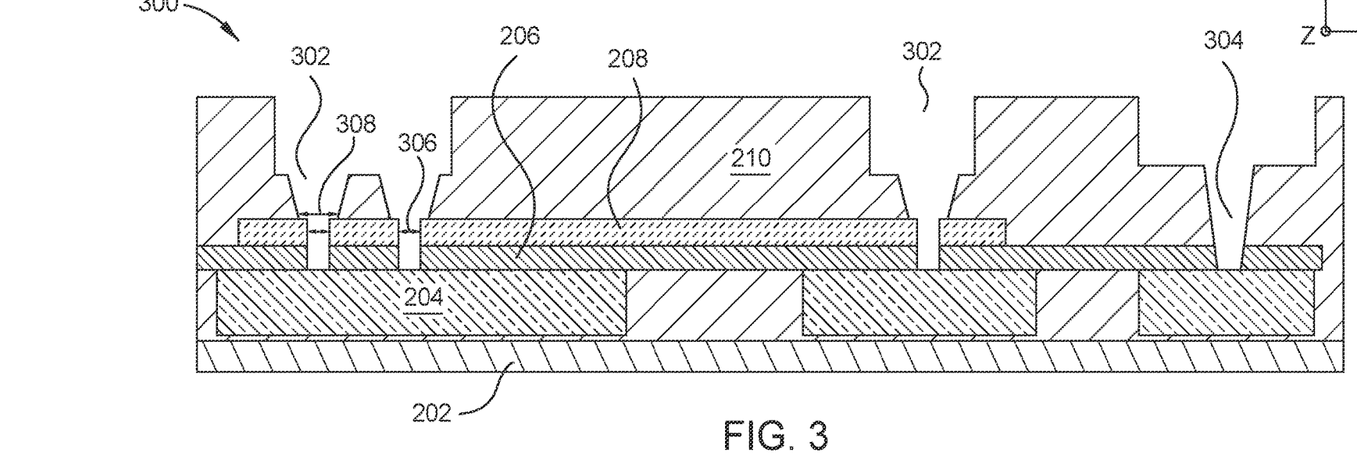
FIG. 3 depicts a structure with openings formed therein according to some embodiments.

FIG. 3 depicts a structure 300 corresponding to block 108 of the method 100. Specifically, FIG. 3 depicts the structure 300 after forming openings 302 by etching through an interlayer dielectric (ILD) material 210, the resistive layer 208, and the cap layer 206. Additional openings 304 can also be formed through the ILD material 210 and the cap layer 206 at portions of the structure that do not include the resistive layer 208. Without being bound by theory, it is believed that because of the hardness of the resistive layer 208, the width of the openings is reduced at the upper surface of the resistive layer 208, such that the width of the opening in the ILD material 210 (e.g., width 308) is wider than the width of the opening in the resistive layer 208 (e.g., width 306). The reduced width is due to the faster etch rate of the ILD material 210 relative to the resistive layer 208. It has been discovered that the increased width 308 within the ILD material 210 enables forming a structure having lower contact resistance relative to a structure having a uniform width (e.g., width 306) within the ILD material 210 and the resistive layer 208. Although the width 306 of the opening in the resistive layer 208 and the cap layer 206 is uniform in width in FIG. 3, it is also contemplated that the width may vary. For example, in some embodiments, the width 306 of the opening in both the resistive layer 208 and the cap layer 206 decreases from an upper surface of the resistive layer 208 to a lower surface of the cap layer 206.

In some embodiments, the ILD material 210 is a dielectric material having a low dielectric constant, such as about 3.5 or lower. In some embodiments, the ILD material 210 is a low K dielectric material, such as SiCxOyHz. In some embodiments, the ILD material 210 is deposited using chemical vapor deposition (CVD), spin on, or a combination thereof.

Figure 4:
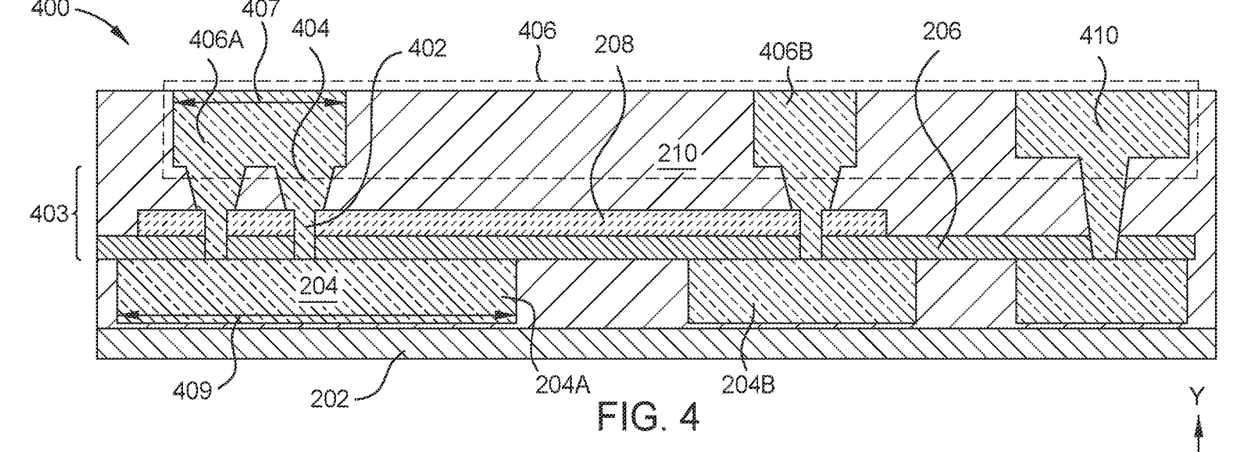
FIG. 4 depicts a structure with contact vias according to some embodiments.

FIG. 4 depicts a structure 400 corresponding to block 110 of the method 100. Specifically, FIG. 4 depicts the structure 400 after filling the openings (e.g., 302 of FIG. 3) with a conductive metal to form contact vias 403. Each contact via 403 includes a first portion 402 and a second portion 404. Each contact via 403 is electrically connected an interconnect portion (e.g., 406A, 406B). In an embodiment, the contact vias 403 include a single first portion 402 and a single second portion 404 electrically connected to a single interconnect portion 406B, as illustrated. In an alternative embodiment, the contact vias 403 include multiple first portions 402 and multiple second portions 404 electrically connected to a single interconnect portion 406A, as illustrated. Moreover, in an embodiment, the structure 400 includes at least one set of contact vias 403 having multiple first and second portions 402, 404 connected to a single interconnect portion 406A and at least one contact via 403 having each first and second portion 402, 404 electrically connected to a single interconnect portion 406B, as illustrated. In some embodiments, the contact via 403 extends through an entire thickness of the resistive layer 208.

Additional contact vias and interconnect portions, such as contact via 405 and interconnect portion 410 can be formed by filling openings (e.g., opening 304 shown in FIG. 3) at the portions of the structure that do not include the resistive layer 208. The additional contact vias 405 and interconnection portions 410 form portions of additional circuits and connects on the substrate. The interconnect portions 406A, 406B, 410 together form a second interconnect layer 406. In some embodiments, the contact vias 403 electrically connect the first interconnect layer 204 with the second interconnect layer 406 disposed on an opposing side of the resistive layer 208. In some embodiments, the conductive material of the contact vias are composed of the same material as the first interconnect layer 204. Alternatively, the conductive material of the contact vias are a different material from the first interconnect layer 204. In some embodiments, the conductive material of contact vias is copper, cobalt, tungsten, alloys thereof, or combinations thereof. Other conductive materials are also contemplated such as other metals and alloys. Each interconnect portion 406A, 406B of the second interconnect can be connected to a portion of the first interconnect layer through the second portions 404 and first portions 402 of the contact vias 403. At least one of the interconnect portions 406A, 406B can have a length 407 less than a length 409 of an interconnect portion 204A, 204B of the first interconnect layer 204 that is electrically connected to the at least one interconnect portion 406A, 406B of the second interconnect layer 406. For example, interconnect portion 406A can have a length 407 that is less than a length 409 of the interconnection portion 204A of the first interconnect layer 204. In some embodiments, a width of each of the interconnect portions 406A, 406B in a Z-direction is about 0.01 µm or wider, such as 0.1 µm to about 1 µm. In some embodiments, the length 407 of each of the interconnect portions 406A, 406B is about 0.03 µm to about 1 µm.

In some embodiments, the interconnect portions 406A, 406B are not necessary for electrical conduction; however, the interconnection portions 406A, 406B are formed to cover the contact vias 403. By way of example, for Cu dual damascene process to form a first portion 402 of the contact via 403, a small metal island or button (e.g., second interconnect portion 406B) is formed to cover the contact via 403. Without being bound by theory, it is believed that due to the small volume of metal (such as Cu) in an interconnect portion 406A, 406B, the electromigration reliability of the contact vias 403 connecting the TFR is significantly enhanced. In some embodiments, the contact vias 403 is immortal to electromigration.

Figure 5:
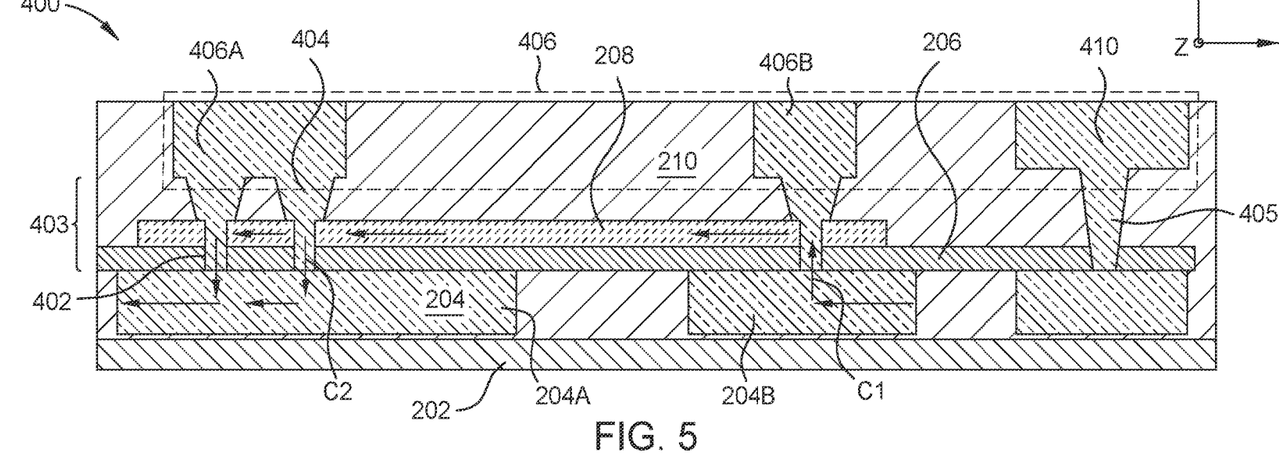
FIG. 5 depicts a thin film resistive structure according to some embodiments.

FIG. 5 depicts an example current flow path for the structure 400 depicted in FIG. 4. Without being bound by theory, it is believed for structures such as the structure 400 having all electrical connections through the first interconnect layer 204 and having small interconnect portions 406A, 406B of the second interconnect layer 406, there is substantially no driving force for current to flow to the second interconnect layer 406. It is further believed that when electrons flow upwards to the resistive layer 208 through contact via 403, such as along current path C1, electromigration resistance for contact via 403 is significantly enhanced due to the lack of current flow through the small interconnect portions 406A, 406B. In some embodiments, such as in the left end of the structure 400, electrons flow downwards from contact via 403 to the first interconnect layer 204 below, such as along current path C2. The contact via 403 having current path flowing downward is at an accumulation mode in which there is no or substantially no electromigration for the contact via 403. In some embodiments, to enhance the first interconnect layer 204 electromigration resistance, individual contact vias 403 individually connected to individual interconnect portions (e.g., 204B) of the first interconnect layer 204 can be implemented. Each interconnect portion 204A can have a short length to enhance electromigration resistance of the first interconnect layer 204.

Figure 6:
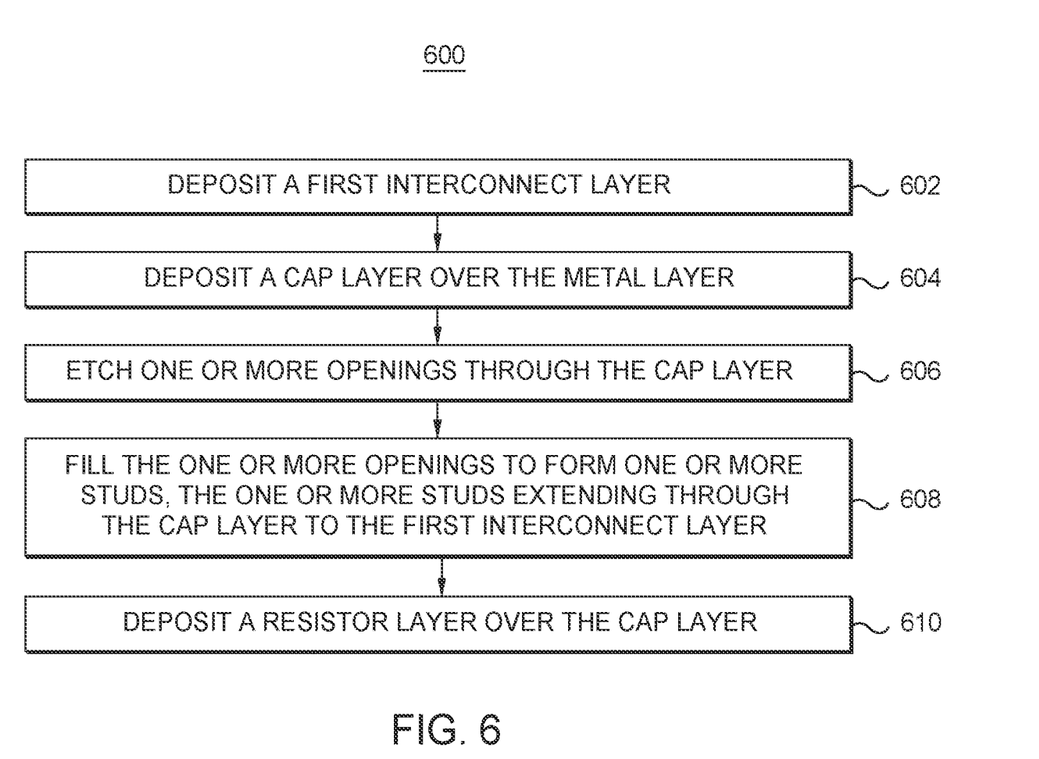
FIG. 6 depicts a flow diagram for a method of forming a thin film resistive structure according to some embodiments.

FIG. 6 depicts a flow diagram for a method 600 of forming a thin film resistive structure according to some embodiments. The method 600 includes, in block 602, depositing a first interconnect layer over a substrate. In block 604, a cap layer is formed over the first interconnect layer, and in block 606, one or more openings are etched through the cap layer. The one or more openings extend through the cap layer to the first interconnect layer. The method further includes, in block 608, filling the one or more openings to form studs. The method further includes, at block 610, depositing a resistive layer over the cap layer. FIGS. 7 to 11 illustrate one example of performing the method 100.

Figure 7:
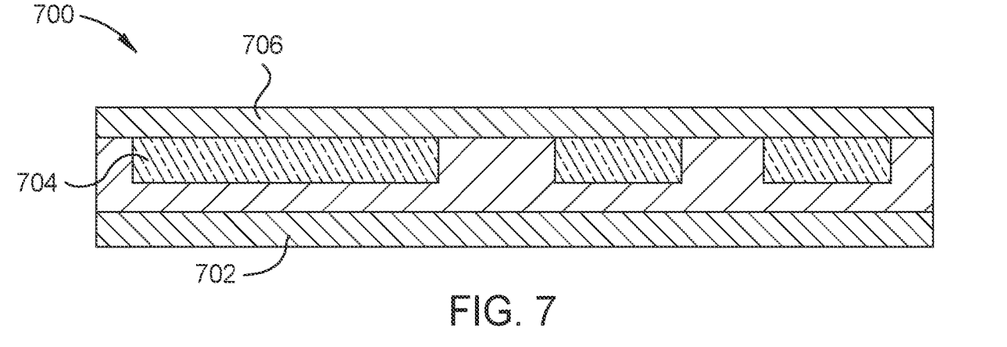
FIG. 7 depicts a structure having a capping layer disposed over a patterned interconnect layer according to some embodiments.

FIG. 7 depicts a structure 700 corresponding to blocks 602 and 604 of method 600. Specifically, FIG. 7 depicts the structure 700 having a substrate 702, such as a semiconductor substrate. In one embodiment, the substrate 702 is similar to the substrate 202 described relative to FIGS. 2 to 5. Each of a first interconnect layer 704 and a cap layer 706 is formed using similar processes and compositions used for the first interconnect layer 204 and cap layer 206 described relative to FIGS. 2 to 5.

Figure 8:
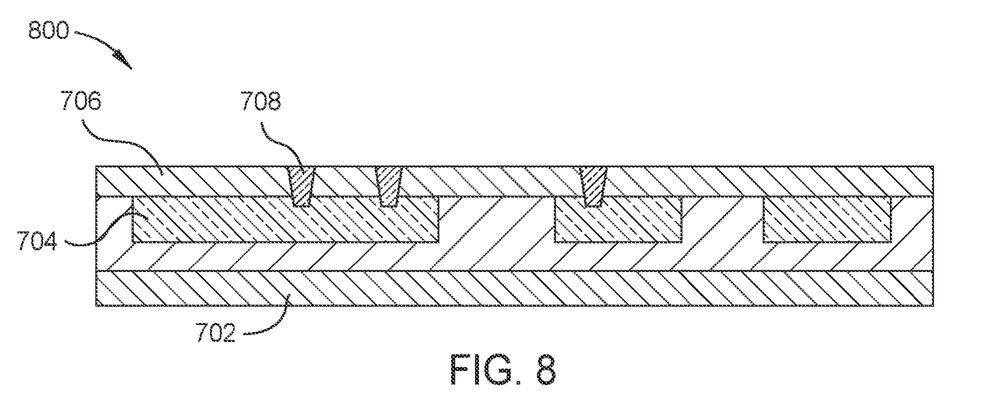
FIG. 8 depicts a structure having studs disposed through a capping layer disposed over a patterned interconnect layer according to some embodiments.
Figure 9:
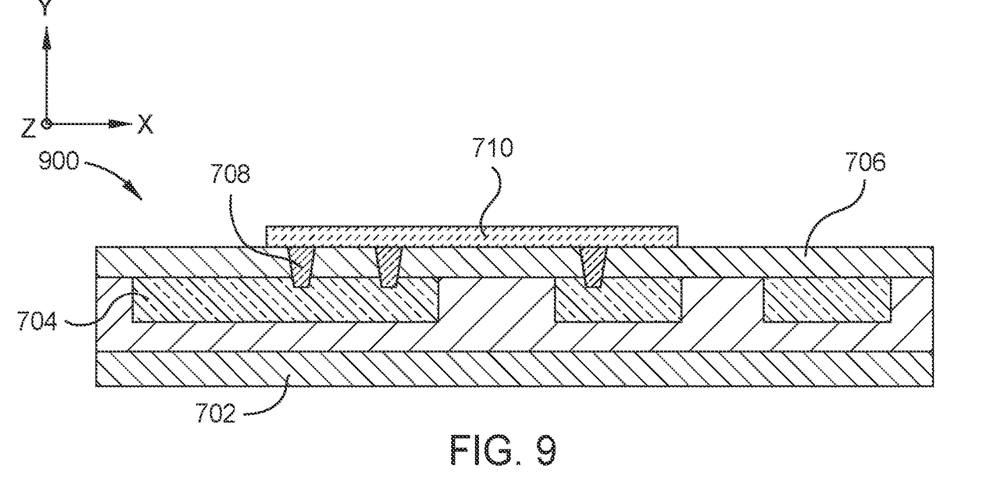
FIG. 9 depicts a structure having a resistive layer disposed over studs according to some embodiments.

FIG. 8 depicts a structure 800 corresponding to blocks 606 and 608 of method 600 of FIG. 6. Specifically, FIG. 8 depicts the structure 800 after etching one or more openings into the cap layer 706 to the first interconnect layer 704, as described in block 606 of FIG. 6. The openings are filled with a conductive material to form studs 708, which corresponds to block 608 of FIG. 6. In some embodiments, the studs 708 are composed of tungsten, copper, cobalt, ruthenium, or a combination thereof, or their alloys. An upper portion of the studs 708 along an upper surface of the cap layer 706 can be planarized, such as by chemical mechanical polishing (CMP). The top surface of the studs 708 are substantially coplanar with the top surface of the cap layer 706. FIG. 9 depicts a structure 900 corresponding to block 610 of method 600 of FIG. 6. Specifically, FIG. 9 depicts the structure 900 after forming a resistive layer 710 over the studs 708 and cap layer 706. In one embodiment, the resistive layer 710 is formed using similar processes and compositions used for the resistive layer 208 described relative to FIGS. 2 to 5.

Figure 10:
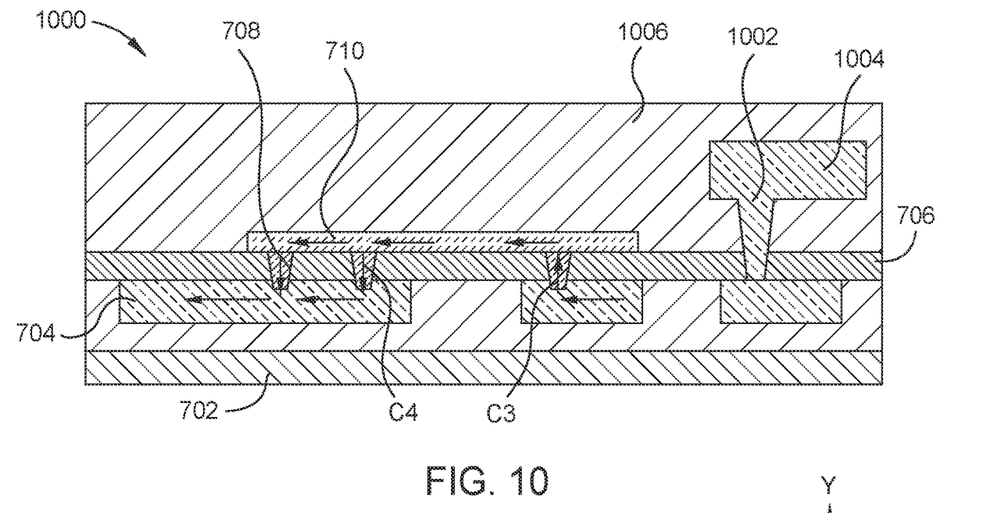
FIG. 10 depicts a thin film resistive structure according to some embodiments.

FIG. 10 depicts a structure 1000 after depositing an interlayer dielectric (ILD) material 1006 over the structure 900. The ILD material 1006 can be any material described relative to the ILD material 210 depicted in FIGS. 2 to 5. One or more openings can be formed at portions of the structure 1000 that do not include the resistive layer 710. The openings can be filled to form a contact via 1002 and an interconnect portion 1004. The interconnect portion 1004 can be electrically connected to the first interconnect layer 704 through the contact via 1002. The interconnect portion 1004 and contact via 1002 form portions of other circuits disposed on the substrate 702 that are not part of the resistive structures.

Similar to the current paths described in FIG. 5, the electrons flow along current path C3 from the first interconnect layer 704, through studs 708 to upper surfaces of the studs 708, and through the resistive layer 710. The resistive layer 710 interfaces the studs 708 at an interface that is coplanar with the upper surfaces of the studs 708. In some embodiments, the electrons flow along current path C4 from the resistive layer 710, downward through the studs 708 through the interface between the studs 708 and resistive layers 710, and through the first interconnect layer 1104. The current paths C3, C4 depicted in FIG. 10 is different from conventional current paths which typically flow from above resistive layer of conventional structures.

Figure 11:
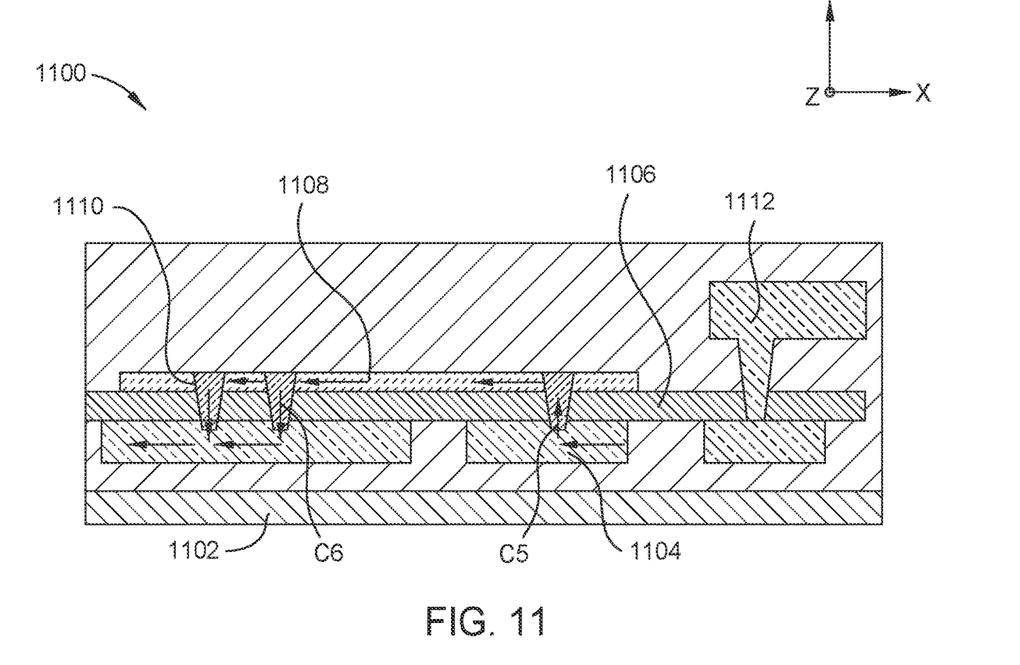
FIG. 11 depicts a thin film resistive structure having studs through a resistive layer according to some embodiments.

Other embodiments are also contemplated such as the structure 1100 shown in FIG. 11 having a substrate 1102, first interconnect layer 1104, cap layer 1106, and studs 1110 that extend through the resistive layer 1108 from a first surface to a second surface of the resistive layer 1108. The process for forming the studs 1110 is similar to method 600 of FIG. 6, except after block 604, a resistive layer 1108 is formed over the cap layer 1106. The one or more openings are etched through the resistive layer 1108 and the cap layer 1106. The openings are filled to form the studs 1110. The upper surface of the studs 1110 can be planarized using chemical mechanical polishing (CMP) methods such that the upper surface of the studs 1110 are substantially coplanar with the upper surface of the resistive layer 1108.

In some embodiments, the structure 1100 includes interconnect portions 1112 disposed in portions of the structure 1100 that are not part of the resistive structure. The interconnect portions 1112 are formed similar to the interconnect portions 1004 described relative to structure 1000 of FIG. 10. Similar to FIG. 10, the electrons flow along current path C5 through the first interconnect layer 1104, through sidewalls of the studs 1110, and through the resistive layer 1108. In some embodiments, the electrons flow along current path C6 through the resistive layer 1108, through a sidewall of the stud 1110, downward through the studs 1110, and through the first interconnect layer 1104. The current paths C5, C6 depicted in FIG. 11 are different from conventional current paths which typically flow from above resistive layer of conventional structures. Without being bound by theory, it is believed that the structure 1100 shown in FIG. 11 has lower contact resistance that the structure 1000 shown in FIG. 10.

In some embodiments, the portions of the studs or contact vias that extend through the cap layer or resistive layer are substantially uniform in length. In some embodiments, the width of the studs or contact vias that extend through the cap layer or resistive layer taper to a more narrow width at portions of the contact via or studs closer to the substrate. For example, the contact via has a width that is tapered from an uppermost portion of the contact via to a lowermost portion of the contact via contacting the first interconnect layer.

In conventional resistive structures, contact vias are formed above the resistive layer and contact only a top surface of the resistive layer. In contrast, the resistors provided herein include more contact interfaces between the via and the resistive layer. For example, the contact vias include sidewall contact with the resistive layer and top contact. It has been discovered that the resistors described herein demonstrated enhanced resistor performance and higher current allowance through the resistor. Additionally, the resistor demonstrated better electromigration reliability, better joule heating tolerance, and better contact resistance. In some embodiments, each of the contact vias described herein include a liner disposed at an interface of the contact vias and the first interconnect. The liner reduces metal atom migration, such as copper migration there through and prevents void formation within the contact vias. As used herein, the "liner" can be composed Ta, TaN, or a combination thereof.

The resistors described herein include contact vias formed in the resistive structures that extend at least partially through a resistive layer of the structure, or at least partially below the resistive layer of the structure. A short length effect is observed for electromigration for the contact vias connecting to the resistors of the present disclosure. The resulting electromigration limit is not sensitive to temperature rise. Moreover, the metal connection line disposed below the resistive layer is at a lower level and enhances thermal dissipation.

In the preceding, reference is made to embodiments presented in this disclosure. However, the scope of the present disclosure is not limited to specific described embodiments. Instead, any combination of the features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages discussed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

While the foregoing is directed to embodiments of the present invention, other and further embodiments of the invention may be devised without departing from the basic scope thereof, and the scope thereof is determined by the claims that follow.

What is claimed is:

1. A resistive structure comprising:
   a semiconductor substrate comprising one or more circuit elements;
   a first interconnect layer disposed on the substrate;
   a resistive layer, wherein the first interconnect layer is between the resistive layer and the semiconductor substrate;
   a dielectric layer disposed between the first interconnect layer and the resistive layer; and
   a contact via extending through the dielectric layer to form an electrical connection between the first interconnect layer and the resistive layer, wherein the contact via extends through at least a portion of the resistive layer.

2. The resistive structure of claim 1, wherein the contact via extends through an entire thickness of the resistive layer and a portion of the contact via disposed above an upper surface of the resistive layer is wider than a portion of the contact via disposed in the resistive layer.

3. The resistive structure of claim 1, wherein a portion of the contact via disposed in the resistive layer and the dielectric layer is substantially uniform in width.

4. The resistive structure of claim 1, wherein a first surface of the contact via contacts a second interconnect layer and a second surface of the contact via contacts the first interconnect layer.

5. The resistive structure of claim 4, further comprising a plurality of contact vias, wherein at least two contact vias contact the second interconnect layer.

6. The resistive structure of claim 1, wherein the contact via is a stud that interfaces the resistive layer at a resistive layer surface that interfaces the dielectric layer.

7. The resistive structure of claim 6, wherein the stud is a metal stud comprising one or more of tungsten, copper, cobalt, ruthenium, alloys thereof, or combinations thereof.

8. The resistive structure of claim 1, wherein the contact via has a width that is tapered from an uppermost portion of the contact via to a lowermost portion of the contact via contacting the first interconnect layer.

9. The resistive structure of claim 1, wherein the dielectric layer is selected from silicon nitride, nitrogen doped silicon carbide, aluminum nitride, oxy-nitride, or combinations thereof.

10. A method for forming a resistive structure, comprising:
    depositing a first interconnect layer on a substrate comprising one or more circuit elements;
    depositing a cap layer over the first interconnect layer;
    depositing a resistive layer over the cap layer;
    etching one or more openings through the resistive layer and the cap layer, the one or more openings extending to the first interconnect layer; and
    filling the one or more openings with a conductive material to form one or more contact vias, wherein the resistive layer contacts the one or more contact vias to form an electrical connection with the first interconnect layer.

11. The method of claim 10, further comprising patterning the first interconnect layer after depositing the first interconnect layer.

12. The method of claim 10, further depositing an interlayer dielectric (ILD) material over the resistive layer prior to etching the one or more openings.

13. The method of claim 12, wherein filling the one or more openings further comprises forming first portions of the one or more contact vias, and second portions of the one or more contact vias disposed over the first portions of the one or more contact vias and in the ILD material.

14. The method of claim 13, wherein the second portions comprise a width greater than a width of the first portion of the one or more contact vias disposed in the resistive layer.

15. The method of claim 10, wherein the one or more contact vias electrically connect the first interconnect layer to a second interconnect layer disposed on an opposing side of the resistive layer.

16. The method of claim 10, wherein the first interconnect layer is composed of copper, cobalt, ruthenium, tungsten, aluminum, alloys thereof, or combinations thereof.

* * * * *